United States Patent
Carlsson

(10) Patent No.: US 12,052,004 B2
(45) Date of Patent: Jul. 30, 2024

(54) RADIO FREQUENCY POWER AMPLIFIER SYSTEM AND METHOD OF LINEARIZING AN OUTPUT SIGNAL THEREOF

(71) Applicant: QuantalRF AG, Zurich (CH)

(72) Inventor: Mats Carlsson, Sundbyberg (SE)

(73) Assignee: QuantalRF AG, Zurich (CH)

(*) Notice: Subject to any disclaimer, the term of this patent is extended or adjusted under 35 U.S.C. 154(b) by 479 days.

(21) Appl. No.: 17/601,038

(22) PCT Filed: Mar. 31, 2020

(86) PCT No.: PCT/EP2020/059151
§ 371 (c)(1),
(2) Date: Oct. 1, 2021

(87) PCT Pub. No.: WO2020/201298
PCT Pub. Date: Oct. 8, 2020

(65) Prior Publication Data
US 2022/0190796 A1    Jun. 16, 2022

(30) Foreign Application Priority Data
Apr. 2, 2019   (EP) ..................................... 19166803

(51) Int. Cl.
H03F 3/24     (2006.01)
H03F 1/32     (2006.01)
H03F 3/195    (2006.01)

(52) U.S. Cl.
CPC ........... *H03F 3/245* (2013.01); *H03F 1/3223* (2013.01); *H03F 3/195* (2013.01); *H03F 2200/451* (2013.01); *H03F 2200/453* (2013.01)

(58) Field of Classification Search
CPC ........ H03F 3/245; H03F 1/3223; H03F 3/195; H03F 2200/451; H03F 2200/453; H03F 1/3229; H03F 1/3247; H03F 2200/456
(Continued)

(56) References Cited

U.S. PATENT DOCUMENTS 5,434,538 A    7/1995  Lee
5,877,654 A    3/1999  Fong
(Continued)

FOREIGN PATENT DOCUMENTS

CN    104682910 A    6/2015
EP    2685630 A1     1/2014
(Continued)

OTHER PUBLICATIONS

European Patent Office, International Search Report and Written Opinion for International Application No. PCT/US2022/015863 dated May 12, 2022, 18 pages.
(Continued)

*Primary Examiner* — Hieu P Nguyen
(74) *Attorney, Agent, or Firm* — COOLEY LLP

(57) ABSTRACT

The present disclosure relates to a radio frequency power amplifier system (200) comprising a first (114) and a second input port (121). The radio frequency power amplifier system (200) comprises a main amplifier (101) having an input (107) and an output (108) and a first (102) and a second auxiliary amplifier (122) having respective inputs (109, 129) and outputs (110, 128). The radio frequency power amplifier system (200) comprises an internal load (103) connected to the output (110) of the first auxiliary amplifier (102), a feedback network (104) having an input end (111) connected to the output (110) of the first auxiliary amplifier (102) and an output end (112) connected to the input (109) of the first auxiliary amplifier (102). The radio frequency power amplifier system (200) also comprises a feedforward amplifier (123) having an input (124) and an output (130). The inputs (107, 129, 109) of the main amplifier and the auxiliary amplifiers are interconnected with the first input port (114) at a common input node (113), the output (128) of the second auxiliary amplifier (122) and the second input port (121) are
(Continued)

interconnected with the input (124) of the feedforward amplifier (123) at a common node (127) and the outputs (130,108) of the feedforward amplifier (123) and the main amplifier (101) are interconnected at a common output node (125). The main amplifier (101) is a replica of the first auxiliary amplifier (102) with an increased gain and the second auxiliary amplifier (122) is a replica of the first auxiliary amplifier (102).

13 Claims, 4 Drawing Sheets

(58) Field of Classification Search
USPC .............................. 330/151, 295, 124 R, 149
See application file for complete search history.

(56) References Cited

U.S. PATENT DOCUMENTS

| | | | |
|---|---|---|---|
| 6,236,274 | B1 | 5/2001 | Liu |
| 6,744,314 | B2 * | 6/2004 | Zhang .................. H03F 1/3223 |
| | | | 330/149 |
| 7,339,436 | B2 | 3/2008 | Fu et al. |
| 7,486,137 | B2 | 2/2009 | Magoon et al. |
| 7,764,125 | B2 | 7/2010 | Dawe |
| 7,786,807 | B1 | 8/2010 | Li et al. |
| 8,102,213 | B2 | 1/2012 | Tasic et al. |
| 8,306,494 | B2 | 11/2012 | Ojo |
| 8,446,217 | B2 | 5/2013 | Bagga |
| 9,941,949 | B2 | 4/2018 | Kessel |
| 10,763,228 | B2 | 9/2020 | Seebacher et al. |
| 11,205,998 | B2 | 12/2021 | Kong et al. |
| 11,206,006 | B2 | 12/2021 | Bagga |
| 2005/0001680 | A1 | 1/2005 | Ratzel |
| 2007/0285162 | A1 | 12/2007 | Vitzilaios et al. |
| 2009/0245541 | A1 | 10/2009 | Wang |
| 2009/0251217 | A1 | 10/2009 | Keerti |
| 2011/0148527 | A1 | 6/2011 | Bagga |
| 2013/0241672 | A1 | 9/2013 | Tamaru et al. |
| 2013/0250536 | A1 | 9/2013 | Satake |
| 2014/0184334 | A1 | 7/2014 | Nobbe et al. |
| 2014/0191800 | A1 | 7/2014 | Jordan |
| 2014/0204806 | A1 | 7/2014 | Chuang et al. |
| 2016/0079930 | A1 | 3/2016 | Jin |
| 2016/0336983 | A1 | 11/2016 | Wang et al. |
| 2018/0062682 | A1 | 3/2018 | Wloczysiak et al. |
| 2018/0167038 | A1 | 6/2018 | Lee |
| 2020/0186177 | A1 | 6/2020 | Gorbachov |
| 2021/0250111 | A1 | 8/2021 | Mori |
| 2022/0102070 | A1 | 3/2022 | Fard |
| 2022/0103131 | A1 | 3/2022 | Fard |
| 2022/0103132 | A1 | 3/2022 | Fard |
| 2022/0103133 | A1 | 3/2022 | Fard |
| 2022/0103134 | A1 | 3/2022 | Fard |
| 2022/0337205 | A1 | 10/2022 | Fard et al. |
| 2022/0385238 | A1 | 12/2022 | Fard et al. |
| 2024/0072766 | A1 | 2/2024 | Fard et al. |
| 2024/0080007 | A1 | 3/2024 | Fard et al. |
| 2024/0080017 | A1 | 3/2024 | Fard et al. |

FOREIGN PATENT DOCUMENTS

| | | |
|---|---|---|
| JP | S6355805 B2 | 11/1988 |
| JP | 2003273664 A | 9/2003 |
| JP | 2006269653 A | 10/2006 |
| JP | 2011517232 A | 5/2011 |
| JP | 2018098565 A | 6/2018 |
| WO | WO-2010007177 A1 | 1/2010 |
| WO | WO-2020201298 A1 | 10/2020 |
| WO | WO 2022/067205 A1 | 3/2022 |
| WO | WO-2022067201 A1 | 3/2022 |
| WO | WO-2022067202 A1 | 3/2022 |
| WO | WO-2022067203 A1 | 3/2022 |
| WO | WO-2022067208 A1 | 3/2022 |
| WO | WO-2023073197 A1 | 5/2023 |
| WO | WO-2023073199 A1 | 5/2023 |
| WO | WO-2024050443 A1 | 3/2024 |

OTHER PUBLICATIONS

Hsiao, C., et al., "CMOS Distributed Amplifiers Using Gate-Drain Transformer Feedback Technique," IEEE Transactions on Microwave Theory and Techniques, IEEE, USA, vol. 61, No. 8, Aug. 2, 2013 (Aug. 2, 2013), pp. 2901-2910, XP011522368.

Shailesh., et al., "A State-of-the Art Review on Distributed Amplifiers," Wireless Personal Communications, Nov. 23, 2020, vol. 117(2), pp. 1471-1525, [online], Retrieved from the Internet: URL: http://link.springer.com/article/10.1007/s11277-020-07932-9/fulltext.html.

The International Bureau of WIPO, International Preliminary Report on Patentability for International Application No. PCT/US2021/052245 dated Apr. 4, 2023, 8 pages.

The International Bureau of WIPO, International Preliminary Report on Patentability for International Application No. PCT/US2022/015863 dated Apr. 13, 2023, 7 pages.

The International Bureau of WIPO, International Preliminary Report on Patentability for PCT/US2021/052242, Mar. 28, 2023, 9 pages.

United States Patent and Trademark Office, International Preliminary Report on Patentability for PCT/US2021/052236, Dec. 9, 2022, 22 pages.

The International Bureau of WIPO, International Preliminary Report on Patentability for International Application No. PCT/US21/52237, Aug. 9, 2023, 6 pages.

European Patent Office, International Search Report and Written Opinion for PCT/US2021/052236, Jan. 7, 2022, 18 pages.

European Patent Office, International Search Report and Written Opinion for PCT/US2021/052239, Jan. 4, 2022, 18 pages.

European Patent Office, International Search Report and Written Opinion for PCT/US2021/052242, Jan. 7, 2022, 18 pages.

European Patent Office, International Search Report and Written Opinion for PCT/US2021/052245, Jan. 20, 2022, 18 pages.

European Patent Office, International Search Report and Written Opinion for PCT/EP2020/059151, Oct. 7, 2020, 13 pages.

European Patent Office, International Search Report and Written Opinion for PCT/US2021/052237, Jan. 7, 2022, 18 pages.

Gefers, et al., A 1.2V, 200 W rail-to-rail Op Amp with 90dB THD using replica gain enhancement, Solid-State Circuits Conference, Sep. 24-26, 2002, pp. 175-178.

Jeon et al., A Transformer Feedback Wideband CMOS LNA for UWB Application, 2015 Asia-Pacific Microwave Conference (APMC), IEEE, Dec. 6, 2015, pp. 1-3.

Liscidini, et al., Common Gate Transformer Feedback LNA in a High IIP3 Current Mode RF CMOS Front-End, Conference 2006, IEEE, Sep. 10, 2006, pp. 25-28.

Ock, et al., A Cartesian Feedback Feedforward Transmitter, Circuits and Systems (ISCAS), 2011 IEEE International Symposium On, IEEE, May 15, 2011, pp. 209-212.

Reiha, et al., A 1.2 V Reactive-Feedback 3.1-10.6 GHz Low-Noise Amplifier in 0.13 CMOS, IEEE Journal of Solid-State Circuits, May 1, 2007, pp. 1023-1033, vol. 23, No. 5.

Stochino, Audio Design Leaps Forward?, Electronics World, Oct. 1, 1994, pp. 818-820, vol. 100, No. 1703.

Wang, et al., A 69.5-79 GHz Low Noise Amplifier in 65-nm CMOS employing transformer feedback technique, 2018 14th IEEE International Conference on Solid-State and Integrated Circuit Technology (ICSICT), 2018, 3 pages.

Wu, et al., Design and Analysis of CMOS LNAs with Transformer Feedback for Wideband Input Matching and Noise Cancelation, IEEE Transactions on Circuits and Sysems 1: Regular papers, IEEE, May 25, 2017, pp. 1626-1635, vol. 64, No. 6.

Zhang, et al., Linearization Techniques for CMOS Low Noise Amplifiers: A Tutorial, IEEE Transactions on Circuits and Systems I: Regular Papers, Jan. 1, 2011, pp. 22-36, vol. 58, No. 1.

Huang et al., Quasi-lumped Bandpass Filter With Sharp Transition Edge and Wide Stopband Rejection, Electronic Letters, Mar. 2013, pp. 479-480.

(56) References Cited

OTHER PUBLICATIONS

International Search Report and Written Opinion for International Application No. PCT/US2023/073197, mailed on Jan. 23, 2024, 16 pages.
International Search Report and Written Opinion for International Application No. PCT/US2023/073198 dated Jan. 8, 2024, 14 pages.
International Search Report and Written Opinion for PCT Application No. PCT/US2023/073199 dated Jan. 23, 2024, 10 pages.
International Preliminary Report on Patentability for International Application No. PCT/US2021/052237, dated Aug. 9, 2023, 6 pages.

* cited by examiner

RADIO FREQUENCY POWER AMPLIFIER SYSTEM AND METHOD OF LINEARIZING AN OUTPUT SIGNAL THEREOF

CROSS-REFERENCE TO RELATED APPLICATIONS

This application is a U.S. National Phase Application under 35 U.S.C. § 371 of International PCT Application No. PCT/EP2020/059151, filed Mar. 31, 2020, which designated the United States and which claims priority to European Patent Application No. 19166803.7, filed Apr. 2, 2019, the disclosures of all of which are hereby incorporated by reference in their entirety.

TECHNICAL FIELD OF THE INVENTION

The present inventive concept relates to the field of radio frequency power amplifier systems. In particular, the present inventive concept relates to a device enabling the linearization of the relation between its input and an output signal and to a method for conducting such linearization.

BACKGROUND OF THE INVENTION

It is well known that the output signal from a radio frequency power amplifier can be linearized by various techniques, such as pre-distortion, feed-forward error correction, and feedback. These techniques are well described in both text books as well as in various scientific and white papers, e.g. the white paper entitled Linearizing High Power Amplifiers, by Allen Katz, Linear Technology Inc, and may be summarized as followed:

The pre-distortion technique can be implemented either as analog or digital pre-distortion. In both ways, the behavior of the power amplifier is characterized, and its response is compensated for by deliberately distorting the signal that drives the power amplifier. If the applied distortion on the input signal is carefully selected, the output signal from the power amplifier could become more linear. However, the main issues with such technique stands in the fact that initial calibration and training is often required and pre-distortion systems are often sensitive to drift, e.g. drift in temperature.

Another known technique is the feedback method which can be described by the use of a so called Cartesian feedback. In a Cartesian feedback system, the response from the power amplifier is down-converted and compared with the base-band IQ signals. This approach eliminates issues with drift and detailed characterization of the transfer function of the power amplifier. A main drawback with a Cartesian feedback system is stability problems and a limited bandwidth that it can handle while still maintaining a stable operation. Cartesian feedback is therefore not suitable for systems where the signal bandwidth is increased to hundreds of MHz (e.g. the wireless communication standard 802.11ac where the largest bandwidth is 160 MHz). Cartesian feedback is also adding circuit complexity and power dissipation.

Linear feedback is also used to linearize power amplifiers. Such technique involves a feedback network from the power amplifier output to its input. This method gives superior performance but is very difficult to get stable for all different load conditions.

Even though the above mentioned techniques allow for a certain level of linearization, there is a need for a technology allowing the linearization of power amplifier signals to be improved.

SUMMARY OF THE INVENTION

An object of the present inventive concept is to provide a technology that addresses at least some of the above concerns. This and other objects, which will become apparent in the following, are accomplished by a method and a device as defined in the independent claims. Preferable embodiments are defined in the dependent claims.

According to a first aspect of the present inventive concept, there is provided a radio frequency power amplifier system comprising a first and a second input port arranged to receive a first and a second input signal respectively. The radio frequency power amplifier system comprises a main amplifier having an input and an output and a first and a second auxiliary amplifier having respective inputs and outputs. The radio frequency power amplifier system comprises an internal load connected to the output of the first auxiliary amplifier, a feedback network arranged to linearize the first input signal and having an input end connected to the output of the first auxiliary amplifier and an output end connected to the input of the first auxiliary amplifier. The radio frequency power amplifier system also comprises a feedforward amplifier having an input and an output.

The inputs of the main amplifier and the auxiliary amplifiers are interconnected with the first input port at a common input node, the output of the second auxiliary amplifier and the second input port are interconnected with the input of the feedforward amplifier at a common node and the outputs of the feedforward amplifier and the main amplifier are interconnected at a common output node.

The main amplifier is a replica of the first and second auxiliary amplifiers with an increased gain and the second auxiliary amplifier is a replica of the first auxiliary amplifier.

The ratio of the second input signal over the first input signal input is the same as the ratio of the gain provided by the second auxiliary amplifier over the gain provided by the first auxiliary amplifier.

The second auxiliary amplifier, the second input port and the feedforward amplifier together form a feedforward network arranged to at least partially remove a deviation from the output of the main amplifier.

According to a second aspect of the present inventive concept, there is provided a method of linearization of an output signal of a radio frequency power amplifier system according to the first aspect. The method comprises obtaining the deviation from an ideal response of the first auxiliary amplifier by means of the feedback network, isolating said deviation by removing the second input signal from the output of the second auxiliary amplifier, amplifying the isolated deviation by means of the feedforward amplifier and adding said amplified deviation to the output of the main amplifier.

The radio frequency power amplifier system defined in the first aspect of the present inventive concept may thus be used to perform the method of the second aspect.

The present inventive concept allows for (i) an indirect feedback to the main amplifier to be combined with (ii) a feed forwarded deviation to the output of the main amplifier permitting the transfer function between the input signal and the output signal of the radio frequency power amplifier system to be improved.

With respect to the indirect feedback (i), the feedback network arranged around the first auxiliary amplifier is connected to an internal load for which the load conditions are known and stable. Such load conditions allow for the stabilization of the feedback path and thus allows for the linearization of the signal processed by the first auxiliary amplifier. The stable feedback path further allows for an ideal response from the first auxiliary amplifier to a signal to be obtained. As the loop gain of the feedback loop is typically not infinite, a deviation from said ideal response is also obtained. Furthermore, the interconnection at the common input node allows for the input signal of the main amplifier to be the same as the input signal of the first auxiliary amplifier. As the main amplifier represents a replica of the first auxiliary amplifier, it allows for the response of the main amplifier to an input signal to be a replica of the response of the first auxiliary amplifier to a same input signal. The indirect feedback therefore permits for the output signal of the main amplifier to be linearized (i.e. less distorted) but to carry an amplified deviation from the ideal response of the first auxiliary amplifier dependent to the finite loop gain of the feedback loop.

With respect to the feed forwarded deviation (ii), the interconnection at the common input node allows also for the input signal of the second auxiliary amplifier to be the same as the input signal of the first auxiliary amplifier. As the second auxiliary amplifier is a replica of the first auxiliary amplifier, it allows for the output signal of the second auxiliary amplifier to be similar to, increased or decreased from the output signal of the first auxiliary amplifier i.e. a linearized output signal comprising a similar, increased or decreased deviation from the ideal response of the first auxiliary amplifier due to the finite loop gain of the feedback loop. The feedforward network, composed of the second auxiliary amplifier, the common node and the feedforward amplifier, connected in parallel to the main amplifier further allows for said comprised deviation to be isolated from the total output signal of the second auxiliary amplifier and to be amplified by the feedforward amplifier. The isolation of the deviation is made possible by the subtraction of a signal, provided by the second input port, from the output signal of the second auxiliary amplifier via the common node of the feedforward network. The feedforward network then permits for the amplified deviation to be added to the output signal of the main amplifier resulting in the complete, or at least significant, removal of the deviation from the ideal response dependent of the finite loop gain of the feedback loop.

The present inventive concept therefore allows for the improvement of the relation between the input signal and the output signal in radio frequency power amplifiers. Such concept enables the suppression of non-linearities of said relation over a wider frequency range of operation by improving the removal of distortions generated when amplifying the input signal and by the complete, or at least significant, removal of deviations dependent to the finite loop gain of the feedback loop. Furthermore, the combination of indirect feedback and feedforwarded deviation allows for the present inventive concept to decrease its sensitivity to drift compared to other linearization techniques mentioned in the prior art. The present inventive concept allows for the reduction of power dissipation losses and is highly suitable for chip-integration, both in CMOS and Bipolar technologies for which an implementation example will be explained further in the detailed description of embodiments.

In the present application, the main amplifier and the auxiliary amplifiers may be understood as representing transconductance amplifiers, voltage amplifiers, current amplifiers, transimpedance amplifiers and/or power amplifiers.

The feedforward amplifier may be understood as representing a current amplifier, a voltage amplifier, a transconductance amplifier, a transimpedance amplifier and/or a power amplifier.

The gain of an amplifier may be understood as the factor by which the signal is increased from the input to the output of said amplifier. The gain of an amplifier represents the signal ratio or amplitude ratio of its output signal to its input signal. For example, if the main amplifier has a gain of nA, its output signal will represent its input signal increased by a factor nA.

A loop gain may be understood as the gain provided by a feedback network multiplied by the gain in the forward amplifier path. For example, if an amplifier (forward amplifier) provides a gain of A around which is connected a feedback path providing a gain of $\beta$, the loop gain of the feedback loop will be $A\beta$.

An ideal response, or ideal case, of an amplifier to an input signal may be understood as a completely linear behavior of the amplifier. Such an ideal response indicates the absence of distortion and other non-linearities between the input signal and the output signal of the amplifier.

A replica of an amplifier may be understood as defining an amplifier responding similarly to a same input signal but providing a different gain to said signal. A replica of an amplifier may therefore define the relation between the gain provided by one amplifier and the gain provided by another amplifier to an input signal. For example, the main amplifier of the present inventive concept represents a scaled up replica of the first auxiliary amplifier in which the relation between the gains of said amplifiers follows a factor n:1, i.e. if the gain of the first auxiliary amplifier is A, the gain provided by the main amplifier will be nA.

A node or common node may be understood as an interconnection between at least two of an input and an output of an amplifier and may be represented by at least one of a summator, a subtractor or a general interconnection of conductors.

According to an embodiment, the main amplifier and the auxiliary amplifiers may be configured to provide the same response to an input signal. As the second auxiliary amplifier is a replica of the first auxiliary amplifier and the main amplifier is also a replica of the first auxiliary amplifier, the response all amplifiers have to a same input signal may be similar with regards to linearity. Such linearity may be improved by the feedback loop as all amplifiers' inputs are interconnected at the common input node inside said feedback loop. The deviation from the ideal response of the first auxiliary amplifier is also carried through the second auxiliary amplifier and the main amplifier as they all are driven by the same input signal which is dependent to the finite loop gain of the feedback loop. However, the gain differs between the main amplifier and the auxiliary amplifiers as the main amplifier is a scaled up replica of the first auxiliary amplifier therefore providing a larger gain. The second auxiliary amplifier may also provide a different gain compared to the first auxiliary amplifier.

According to an embodiment, the first input port of the radio frequency power amplifier system and the feedback network output end may be connected to the common input node via a subtractor. Such a subtractor allows for the feedback signal to be subtracted from the signal of the first input port in order to suppress the non-linearities between the input signal and the output signal of the first auxiliary amplifier. Such a subtractor does not have to be a separate physical circuit, it may be a connection node to which the feedback signal is fed in such a state that it is subtracted from the input signal of the first input port.

According to an embodiment, the common node at which the outputs of the second auxiliary amplifier and the second input port are interconnected with the input of the feedforward amplifier may be a subtractor. Such a subtractor allows for the input signal of the second input port to be subtracted from the output signal of the second auxiliary amplifier. Such a subtraction allows for the deviation dependent to the finite loopgain of the feedback loop of the first auxiliary amplifier to be isolated from the total output signal of the second auxiliary amplifier. Such a subtractor thus allows for the input signal of the feedforward amplifier to only represent the deviation to be amplified and feedforwarded to the output of the main amplifier.

According to an embodiment, the ratio of the input signal provided by the second input port over the input signal provided by the first input port may be the same as the ratio of the gain provided by the second auxiliary amplifier over the gain provided by the first auxiliary amplifier. The present embodiment is advantageous in that it ensures that the deviation comprised in the output signal of the second auxiliary amplifier may be isolated from the rest of the output signal. Indeed, as the input signal of the second auxiliary amplifier is the same as the input signal of the first auxiliary amplifier, the signal provided by the second input port, which is to be subtracted from the output signal of the second auxiliary amplifier, should be scaled similarly in relation to the signal provided by the first input port as the scaling of the second auxiliary amplifier in relation to the first auxiliary amplifier. In other terms, if the second auxiliary amplifier has a gain ratio of 1:m in relation to the first auxiliary amplifier, the input signal provided by the second input port must have a signal ratio of 1:m in relation to the input signal provided by the first input port. For example, if the second auxiliary amplifier provides a gain of 0.5 to its input signal, the input signal provided by the second input port should represent half the input signal provided by the first input port.

According to an embodiment, the feedforward amplifier may be configured to provide a gain such that its output signal has the same amplitude but opposite phase as the output signal of the main amplifier. The present embodiment is advantageous in that it allows the output signal of the feedforward amplifier to represent an amplification of the deviation generated by the finite loop gain of the feedback network of the first auxiliary amplifier having the same amplitude but opposite phase as the deviation comprised in the output signal of the main amplifier resulting in a complete, or at least significant, removal of said deviation dependent on the finite loop gain. Furthermore, the gain provided by the feedforward amplifier may be dependent on the gain provided by the second auxiliary amplifier. For example, if the gain provided by the second auxiliary amplifier is 0.5 and the gain provided by the main amplifier is 4, the gain provided by the feedforward amplifier must be 8. It is to be noted that an output signal from the feedforward amplifier having an amplitude lower than the amplitude of the output signal of the main amplifier allows a partial removal of the deviation comprised in said output signal therefore still resulting in an improved linearization.

According to an embodiment, the common output node at which the outputs of the feedforward amplifier and the main amplifier are interconnected may be a summator. Such a summator allows for the amplified deviation, representing the output signal of the feedforward amplifier, to be added (i.e. feedforwarded) to the output of the main amplifier. Such summation thus allows the complete, or at least significant, removal of the deviation dependent to the finite loop gain of the feedback loop from the output signal of the main amplifier.

According to an embodiment, each one of the auxiliary amplifiers may comprise a first transistor and a second transistor connected in series. The type of transistor used in the present inventive concept may comprise, but is not limited to, metal-oxide semiconductor field effect transistors (MOSFET) and/or bipolar junction transistors (BJT). Such transistors allow for the modulation of an input signal into an amplified output signal. Furthermore, such transistors may allow for the modulation of power signals, voltage and/or current signals.

According to an embodiment, the main amplifier may comprise a first transistor and a second transistor connected in series. As the main amplifier represents a replica of the first auxiliary amplifier, it comprises similar first and second transistors as said first auxiliary amplifier (e.g.: MOSFET, BJT, etc.) but of a larger size to enable a greater amplification of an input signal i.e.: provide a greater gain.

According to an embodiment, the feedforward amplifier may represent an indirect feedback amplifier. Such indirect feedback amplifier may comprise a feedback network which may serve the same purpose as the feedback network arranged around the first auxiliary amplifier, i.e. reducing the non-linearities between the output signal and the input signal of the feedforward amplifier. Such feedback may be connected to a second internal load for which the load conditions are known and stable therefore allowing stability of the feedback. The feedback network of the feedforward amplifier therefore allows for the deviation from the first auxiliary amplifier to be amplified and feedforwarded to the output of the main amplifier without any noticeable distortion potentially generated by the feedforward amplifier.

According to an embodiment, the radio frequency power amplifier system may be configured to receive an input signal at the first and second input ports which may be provided from a driver circuit preceding the system. An alternative to the present embodiment may be that the radio frequency power amplifier system only comprises one input port. The input signal received at said single input port from the driver circuit preceding the system may then be equally supplied to the common input node and to the common node.

According to an embodiment, the output signal of the radio frequency power amplifier system may be fed to a load. The load and its conditions may dictate the load capability required from the radio frequency power amplifier system i.e. the amplification needed between the input signal and the output signal of the system to power the load. Such load may be represented by any suitable electronic device, e.g. an antenna, a filter, an external power amplifier, a loudspeaker, etc., necessitating an amplified input signal to function.

According to an embodiment, the feedforward amplifier, the main amplifier and the auxiliary amplifiers may be comprised on the same integrated circuit. By "integrated circuit" it is here meant an electronic circuit formed on a significantly small piece of semiconducting material (e.g.: silicon). The present embodiment is advantageous in that it allows for the composition of the circuit of the radio frequency power amplifier system to be of a significantly small size allowing it to be efficient for chip integration application, or the like.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which.

DETAILED DESCRIPTION OF EMBODIMENTS

Figure 1:
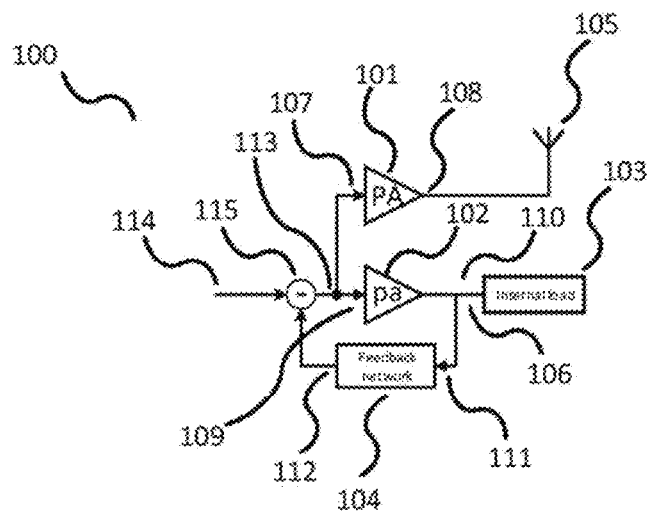
FIG. 1 illustrates a block diagram of a radio frequency power amplifier system with indirect feedback.

FIG. 1 illustrates a block diagram of a radio frequency power amplifier system implementing an indirect feedback linearization technique. The block diagram of FIG. 1 shows a main amplifier 101, having an input 107 and an output 108, a first auxiliary amplifier 102, having an input 109 and an output 110, an internal load 103 connected to the output 110 of the first auxiliary amplifier, and a feedback network 104 having an input end 111 connected to the output 110 of the first auxiliary amplifier 102, and an output end 112 connected to the input 109 of the first auxiliary amplifier 102 via a subtractor 115. The inputs 107, 109 of the main and first auxiliary amplifiers 101, 102 are interconnected at a common input node 113. The power amplifier system 100 has a first input port 114 connected to the common input node 113 via the subtractor 115. The radio frequency power amplifier system 100 is connected to an external load 105, represented in FIG. 1 by an antenna.

The main amplifier 101 constitutes a replica of the first auxiliary amplifier 102. In many applications the scaling factor between the main amplifier 101 and the first auxiliary amplifier 102 may approximately range from 2:1, up to 8:1, however other relations may be provided as well. Such a scaling factor defines the relation between the gain between the input signal and the output signal of the main amplifier 101 and the corresponding gain of the first auxiliary amplifier 102. Thus, for instance, with a scaling factor of 4:1 the gain of the main amplifier 101 is equivalent to 4 times the gain of the first auxiliary amplifier 102.

The radio frequency power amplifier system 100 of FIG. 1 operates as follows: An input signal is supplied to the system from the first input port 114 from which is subtracted the feedback signal, i.e. the output of the feedback network 104, at the subtractor 115. Since the feedback network 104 is connected around the first auxiliary amplifier 102, the feedback network 104 linearizes the first auxiliary amplifier 102 and makes the output signal at its output 106 less distorted. The operation of the feedback network 104 around the first auxiliary amplifier 102 can be made stable since the internal load 103 is known and not accessible from the outside. In other words, the load conditions are known and do not vary. The non-linearities in the first auxiliary amplifier 102 are therefore suppressed due to the feedback network 104. The main amplifier 101 is then driven by the same input signal as the first auxiliary amplifier 102 as both their inputs are interconnected at the common input node 113. Since the main amplifier 101 is a replica of the first auxiliary amplifier 102, it will respond in the same way as the first auxiliary amplifier 102 to said same input signal, resulting in suppressed non-linearities also between the input and output signals of the main amplifier 101. The output signal of the main amplifier 101 is then supplied to the load 105 with an increased linearity.

However, the finite loop gain provided by the feedback loop comprising the first auxiliary amplifier 102 and the feedback network 104 may cause the signal to deviate from the ideal response of the first auxiliary amplifier which may not be compensated for in the present embodiment. Such deviation may be carried through the main amplifier 101 and therefore amplified with the rest of the linearized signal.

Figure 2:
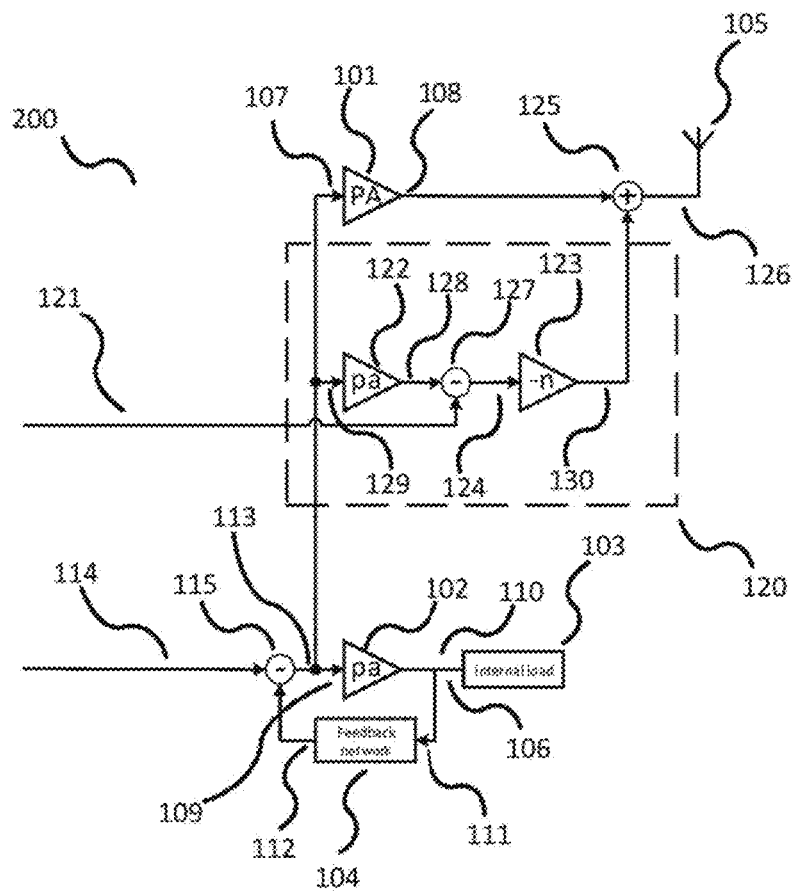
FIG. 2 illustrates a block diagram of an embodiment of a radio frequency power amplifier system according to the present invention, in which indirect feedback is combined with a feedforward deviation.

FIG. 2 shows a block diagram of a radio frequency power amplifier system 200 comprising the radio frequency power amplifier system 100 of FIG. 1 with the addition of a feedforward network 120. The components described in FIG. 1 and their functions are thus identically represented in FIG. 2. The feedforward network 120 of FIG. 2 comprises a second auxiliary amplifier 122 with an input 129 and an output 128. The second auxiliary amplifier 122 is a replica of the first auxiliary amplifier 102. Therefore, both auxiliary amplifiers 102,122 respond in the same way to an input signal. The feedforward network 120 further comprises a feedforward amplifier 123 having an input 124 and an output 130. The input 129 of the second auxiliary amplifier 122 is interconnected with the inputs (107, 109) of the main amplifier 101 and the first auxiliary amplifier 102 at the common input node 113. The output 128 of the second auxiliary amplifier 122 and the second input port 121 are interconnected with the input 124 of the feedforward amplifier 123 at a subtractor 127, and the output 130 of the feedforward amplifier 123 and the output 108 of the main amplifier 101 are interconnected at a common output node 125, represented by a summator. The feedforward network 120 is therefore connected in parallel with the main amplifier 101.

The indirect feedback provided by the feedback network 104 arranged around the first auxiliary amplifier 102 to the main amplifier 101 functions according to the operations of the radio frequency power amplifier system 100 described above with reference to FIG. 1. In addition to the indirect feedback, the feedforward network 120 of the radio frequency power amplifier system 200 operates as follows: The input signal of the second auxiliary amplifier 122 is the same as the input signal of the first auxiliary amplifier 102 which represents a linearized signal comprising a deviation generated by the finite loop gain of the feedback loop. As the second auxiliary amplifier 122 is a replica of the first auxiliary amplifier 102, the output signal of the second auxiliary amplifier 122 is similar to, increased or decreased from, the output signal of the first auxiliary amplifier 102. In addition, an input signal provided at the second input port 121 is scaled with the same ratio to the input signal provided at the first input port 114 as the ratio of the gain of the second auxiliary amplifier 122 to the gain of the first auxiliary amplifier 102. The input signal of the second input port 121 is subtracted from the output signal of the second auxiliary amplifier 122 at the subtractor 127, thus isolating the deviation from the ideal response of the first auxiliary amplifier 102 from the rest of the output signal of the output 128. The input signal 124 of the feedforward amplifier 123 therefore represents only said deviation, which is then amplified by the feedforward amplifier 123 in such way that it comprises the same amplitude as the deviation carried by the output 108 of the main amplifier with a 180° phase shift, i.e.

opposite phase. The summator 125 then adds the amplified deviation to the output 108 of the main amplifier 101 resulting in an output signal 126 which is linearized and from which the deviation from an ideal response of power amplifier is completely, or at least significantly removed. The output signal 126 is then supplied to the load 105.

It will be appreciated that another exemplification of the radio frequency power amplifier system 200 may be such that the amplification of the isolated deviation by the feedforward amplifier 123 is of the same phase as the deviation carried out by the output 108 of the main amplifier 101 but the common output node 125 is represented by a subtractor. It will further be appreciated that another exemplification of the radio frequency power amplifier 200 may be such that the input signal of the second input port 121 comprises a 180° phase shift in comparison to the input signal of the first input port 114 but the common node 127 is represented by a summator.

The operation of the radio frequency power amplifier 200 described in FIG. 2 may be explained further in a mathematical representation. Considering that the gain provided by the first and second auxiliary amplifiers 102, 122 be identical and equal to A, the gain provided by the main amplifier 101 be nA (i.e. n times larger than the gain of the auxiliary amplifiers 102, 122), the gain provided by the feedforward amplifier 123 be −n (i.e.: gain of n with a 180° phase shift) and that the gain provided by the feedback network 104 be β, the signal $S_{113}$ after the subtractor 115 may be expressed as follows:

$$S_{113} = S_{in} - S_{113} A\beta \quad (1)$$

$$S_{113} = S_{in} \frac{1}{1 + A\beta} \quad (2)$$

$S_{in}$ represents the input signal of the first input port 114, $A\beta$ represents the finite loop gain of the feedback loop generating a deviation from the ideal response of the first auxiliary amplifier 102 represented here by the term $$\frac{1}{1 + A\beta}.$$

Similarly, the output signal of the main amplifier 101 and the output signal of the second auxiliary amplifier 122 may be expressed:

$$S_{108} = S_{in} \frac{An}{1 + A\beta} \quad (3)$$

$$S_{128} = S_{in} \frac{A}{1 + A\beta} \quad (4)$$

and the output signal from the subtractor 127 may be expressed:

$$S_{124} = S_{in} \frac{A}{1 + A\beta} - S_{in} = S_{in} \left[ \frac{A}{1 + A\beta} - 1 \right] \quad (5)$$

The output signal $S_{124}$ of the subtractor 127 is then amplified by the feedforward amplifier 123, and added to the output signal $S_{108}$ of the main amplifier 101, resulting in an output signal 126 as expressed in the following equation.

$$S_{out} = \quad (6)$$
$$-S_{in} n \left[ \frac{A}{1 + A\beta} - 1 \right] + S_{in} \frac{An}{1 + A\beta} = S_{in} \left[ \frac{An}{1 + A\beta} - \frac{An}{1 + A\beta} + n \right] = S_{in} n$$

The above equation shows that the dependence of the loop gain $A\beta$, i.e. the deviation from the ideal response of the amplifier in the relation between the output and the input of the radio frequency power amplifier system 200 is removed.

Hence, in contrast to the linearization techniques of the prior art, the signal processing carried out with the added feedforward network 120 results in a more well-defined relation between the output signal and the input signal, resulting in an improved linearity.

Figure 3:
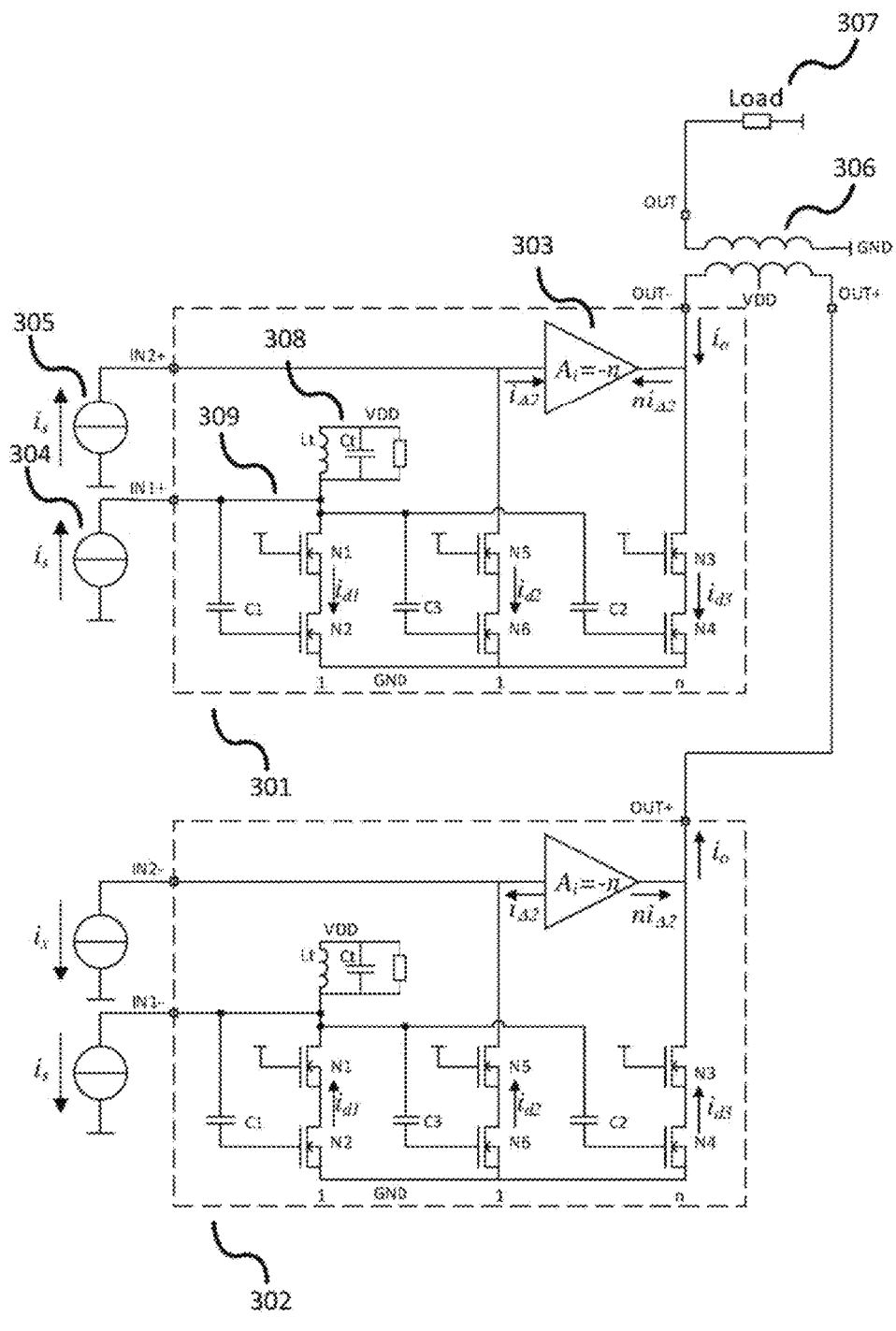
FIG. 3 illustrates an example circuit of a CMOS based implementation of the radio frequency power amplifier of FIG. 2.

FIG. 3 shows an example of a CMOS based implementation of the present inventive concept. FIG. 3 illustrates a differential implementation consisting of an upper half 301 and a lower half 302 in which both halves are identical. Each half 301, 302 is driven by an input signal connected to the respective first and second input ports, IN1+ and IN2+ for upper half 301 an IN1− and IN2− for lower half 302. The two input ports are fed by identical currents, but opposite in phase, is 304, 305 which are generated from a driver circuit preceding the radio frequency power amplifier system The differential output ports, OUT+ and OUT− respectively, are connected to a transformer 306 which converts the differential output signal into a single ended output signal OUT supplied to the load 307. The different blocks of the radio frequency power amplifier system 200 illustrated in FIG. 2 are described below for the upper half 301 of the CMOS based implementation.

The main amplifier may comprise a capacitance C2 and two transistor devices, n channel MOSFET or NMOS, N3 and N4, respectively. The first auxiliary amplifier is implemented with a capacitance C1 and two transistor devices, NMOS, N1 and N2 respectively, which are connected to an internal load consisting of a parallel resonance circuit 308. The first auxiliary amplifier is implemented in a similar way as the main amplifier, i.e. the two amplifiers provide the same response to input signals. The feedback network may comprise a short circuit 309 from the drain of transistor N1 to the input port IN1+. The two capacitances C1, C2 can be considered as short circuits at the frequency of operation and are not essential for the behavior of the radio frequency power amplifier system. The second auxiliary amplifier is implemented with a capacitance C3 and two transistor devices (NMOS) N5 and N6.

The second auxiliary amplifier is connected in parallel with the main amplifier but is not scaled to provide gain in the present implementation, i.e. the gain provided by the second auxiliary amplifier is the same as the gain in the first auxiliary amplifier. As the auxiliary amplifiers are identical replicas in this implementation, the transistor devices N5 and N6 should be equal in size to the transistor devices N1 and N2 respectively. In this way, the current $i_{d2}$ in the transistor devices N5, N6 becomes, due to indirect feedback, equal to the current $i_{d1}$ in the transistor devices N1, N2. Moreover, the feedforward amplifier 303 may be represented by a current amplifier and provides a gain such that its output signal may have the same amplitude but opposite phase as the output signal of the main amplifier.

The operation of the CMOS implementation of the radio frequency power amplifier of the present invention may be explained with a mathematical representation as follows: The input signal (current is 304) which is fed into the first input port IN1+ generates a voltage at the first input port IN1+ and thereby a voltage at the gate of the transistor device N2. The voltage at the gate of the transistor device N2 generates a current $i_{d1}$ through the transistor devices N1 and N2. Similarly to equation (2) of FIG. 2, the relation between the current $i_{d1}$ and the input current $i_s$ 304 may be expressed by the equation:

$$i_d = -i_s \frac{A\beta}{1-A\beta} \quad (7)$$

In a typical high frequency implementation, the loop gain $A\beta$ may be in the order of −10, resulting in that the current $i_{d1}$ is only approximately 90% of the input current $i_s$ 304. Therefore, a deviation $i_{\Delta 1}$ from the ideal response of the first auxiliary amplifier, for which the current $i_{d1}$ is equal to the input current $i_s$ 304 assuming an infinite loop gain $A\beta$, is represented by the current generated from the voltage across the load impedance of the first auxiliary amplifier. Such relation may be expressed:

$$i_{d1} = i_s - i_{\Delta 1} \quad (8)$$

As the second auxiliary amplifier of the present implementation is an identical replica of the first auxiliary amplifier and both amplifiers have the same input signal, the deviation generated by the finite feedback loop may be carried through the second auxiliary amplifier resulting in the current of the transistor devices N5, N6 being expressed as:

$$i_{d2} = i_s - i_{\Delta 2} \quad (9)$$

from which the deviation may be expressed:

$$i_{\Delta 2} = i_s - i_{d2} \quad (10)$$

As the second auxiliary amplifier provides no gain in the present implementation ($i_{d1} = i_{d2}$) and as the input current of the input ports IN1+, IN2+ are identical, the deviations from an ideal response of the second auxiliary amplifier is equal to the deviation from the ideal response of the first auxiliary amplifier:

$$i_{\Delta 2} = i_{\Delta 1} \quad (11)$$

The deviation $i_{\Delta 2}$ is then amplified by the feedforward amplifier 303 with a gain of −n before being added to the output of the main amplifier. An expression of the output signal at the output port OUT− may thus be written as:

$$i_o = i_{d3} + n i_{\Delta 2} \quad (12)$$

In which $i_{d3}$ represents the current at the transistor devices N3, N4 of the main amplifier. Since the main amplifier is a replica of the first auxiliary amplifier, and the current gain of the main amplifier is the same as the one of the feedforward amplifier, the current $i_{d3}$ may be expressed as:

$$i_{d3} = n i_{d1} \quad (13)$$

The output signal at the output port OUT− may thus be rewritten as:

$$i_o = n i_{\Delta 2} + i_{d3} = n i_{\Delta 2} + n i_{d1} = n(i_{\Delta 2} + i_{d1}) = n(i_{\Delta 1} + i_{d1}) \quad (14)$$

$$i_o = n(i_{\Delta 1} + i_s - i_{\Delta 1}) = n i_s \quad (15)$$

The present inventive concept implemented in a CMOS based application therefore removes the deviation from the ideal response of the amplifier caused by the finite loop gain.

Figure 4:
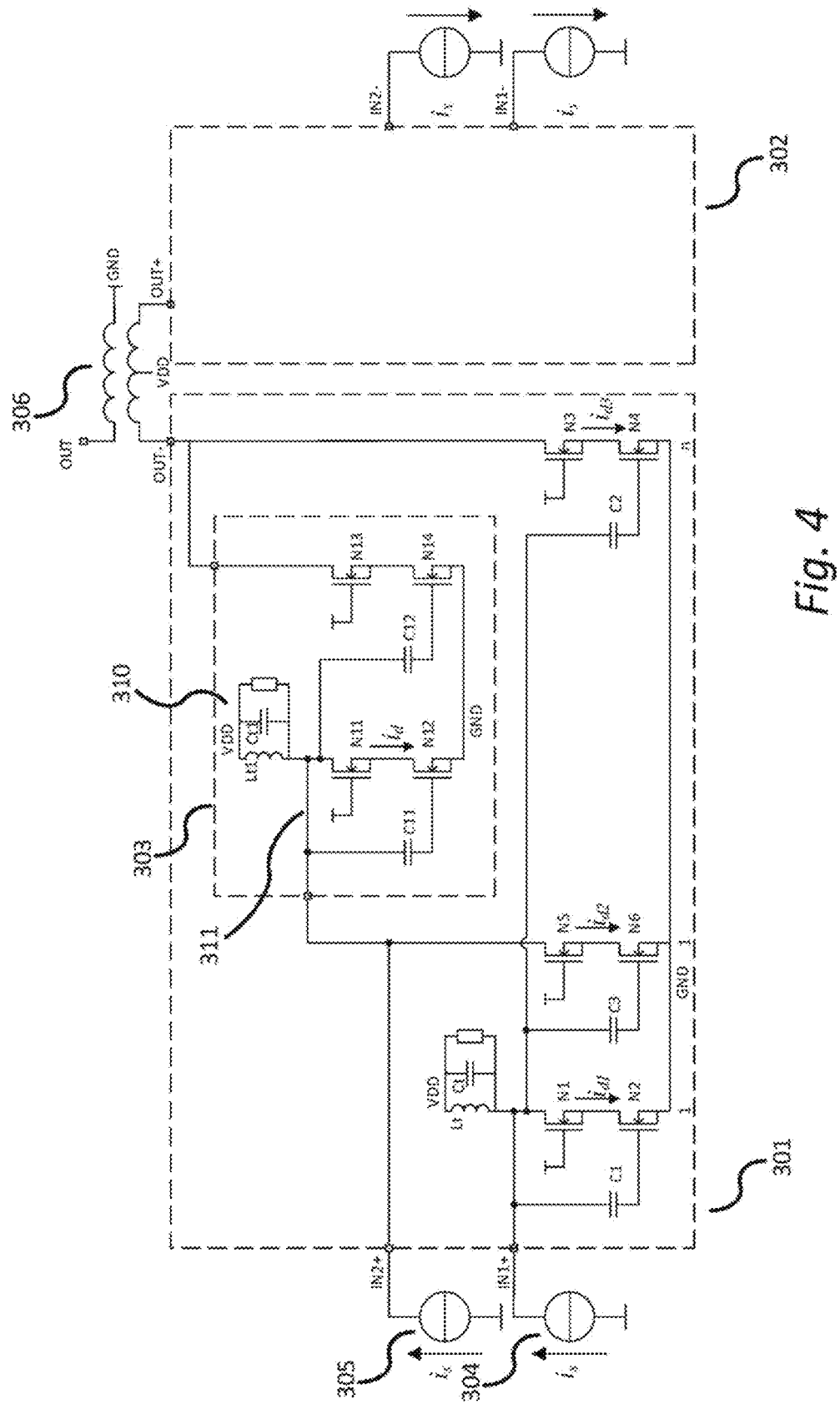
FIG. 4 illustrates an example circuit of the radio frequency power amplifier of FIG. 3 in which an example circuit of the feedforward amplifier is shown; and, FIG. 5 illustrates a comparison of the linearity performance of the system as shown in FIG. 1 and the implementation of the invention as shown in FIGS. 3 and 4.

FIG. 4 shows the example circuit of the CMOS implementation of the radio frequency power amplifier of FIG. 3 with added details regarding the circuit of the feedforward amplifier 303. In FIG. 4, the feedforward amplifier 303 may be represented by a current amplifier and may comprise a capacitance C11 and the transistor devices (NMOS) N11 and N12 respectively, which are connected to an internal load consisting of the parallel resonance circuit 310. The feedforward amplifier 303 therefore has a feedback network consisting of a short circuit 311 from the drain of transistor N11 to the input of the current amplifier 303. The feedforward amplifier 303 further comprises a second capacitance C12 and a second pair of transistor devices (NMOS) N13 and N14 respectively. The example circuit of the amplifier 303 operates with an indirect feedback technique in order to linearize the relation between the input signal and the output signal of the feedforward amplifier 303. The feedback loop presented here also generate a deviation from the ideal case due to its finite loop gain. However, this deviation will not be that noticeable since the input signal level to the feedforward amplifier is small compared to the maximum signal the feedforward amplifier can handle. In the present implementation, the input signal to the feedforward amplifier may represent a much weaker signal than the input signal to the main amplifier 101. Therefore, its deviation is neglectable.

Figure 5:
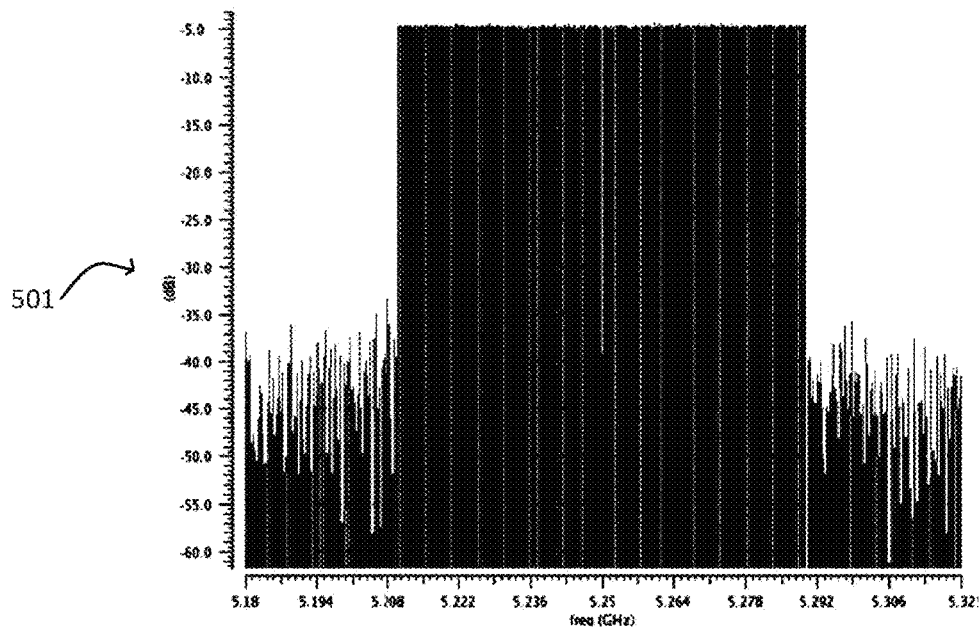
Figure 5:
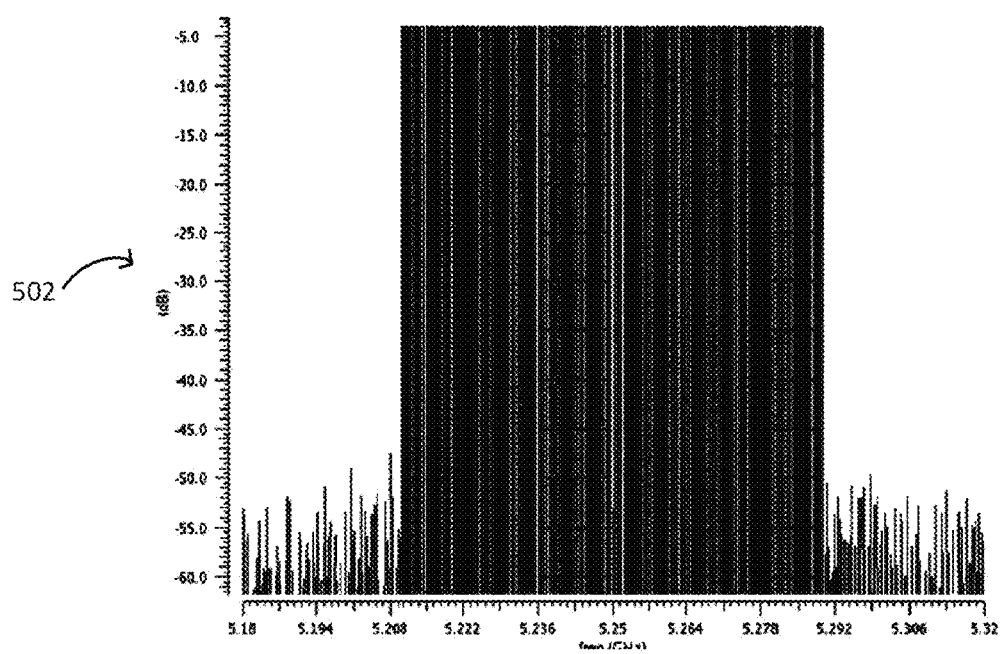

FIG. 5 shows a comparison of the linearity performance of the system shown in FIG. 1 and the implementation of the invention as shown in FIGS. 3 and 4. According to an example, the linearity performances have been simulated with an 80 MHz 802.11ac input signal. The output power level in both simulations is +20 dBm and the response of the radio frequency power amplifier of FIG. 1 is shown in output spectrum 501 and the response of the implemented invention is shown in the output spectrum 502. As can be seen from these results, the EVM (Error Vector Magnitude) performance of the implemented invention is improved by approximately 15 dB compared with the prior art which represents the typical deviation generated by a loop gain of −10. In addition to improved EVM, the invention increases the gain by approximately 0.7 dB compared with the prior art.

While the invention has been illustrated and described in detail in the drawings and foregoing description, such illustration and description are to be considered illustrative or exemplary and not restrictive. The invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:
1. A radio frequency power amplifier system comprising;
   a first and a second input port arranged to receive a first and a second input signal respectively;
   a main amplifier having an input and an output;
   a first auxiliary amplifier and a second auxiliary amplifier having respective inputs and outputs;
   an internal load connected to the output of the first auxiliary amplifier;
   a feedback network arranged to linearize the first input signal and having an input end connected to the output of the first auxiliary amplifier and an output end connected to the input of the first auxiliary amplifier; and,
a feedforward amplifier having an input and an output;
wherein;
the inputs of the main amplifier and the auxiliary amplifiers are interconnected with the first input port at a common input node;
the output of the second auxiliary amplifier and the second input port are interconnected with the input of the feedforward amplifier at a common node;
the outputs of the feedforward amplifier and the main amplifier are interconnected at a common output node;
and wherein;
the main amplifier is a replica of the first and second auxiliary amplifiers with an increased gain;
the second auxiliary amplifier is a replica of the first auxiliary amplifier
the ratio of the second input signal over the first input signal input is the same as the ratio of the gain provided by the second auxiliary amplifier over the gain provided by the first auxiliary amplifier; and
the second auxiliary amplifier, the second input port and the feedforward amplifier together form a feedforward network arranged to at least partially remove a deviation from the output of the main amplifier.

2. The radio frequency power amplifier system according to claim 1, wherein the main amplifier and the auxiliary amplifiers are configured to provide the same response to an input signal.

3. The radio frequency power amplifier system according to claim 1 or 2, wherein the first input port and the feedback network output end are connected to the common input node via a subtractor.

4. The radio frequency power amplifier system according to any one of the preceding claims, wherein the common node is a subtractor.

5. The radio frequency power amplifier system according to any one of the preceding claims, wherein the feedforward amplifier is configured to provide a gain such that its output signal has the same amplitude but opposite phase as the output signal of the main amplifier.

6. The radio frequency power amplifier system according to any one of the preceding claims, wherein the common output node is a summator.

7. The radio frequency power amplifier system according to any one of the preceding claims, wherein each one of the auxiliary amplifiers comprises a first transistor and a second transistor connected in series.

8. The radio frequency power amplifier system according to any one of the preceding claims, wherein the main amplifier comprises a first transistor and a second transistor connected in series.

9. The radio frequency power amplifier system according to any one of the preceding claims, wherein the feedforward amplifier represents an indirect feedback amplifier.

10. The radio frequency power amplifier system according to claim 2, configured to receive an input signal at the first and second input ports from a driver circuit preceding the radio frequency power amplifier system.

11. The radio frequency power amplifier system according to any one of the preceding claims, configured to feed the output signal of said system to a load.

12. The radio frequency power amplifier system according to any of the preceding claims, wherein the feedforward amplifier, the main amplifier and the auxiliary amplifiers are comprised on the same integrated circuit.

13. A method of linearization of an output signal of a radio frequency power amplifier system, the system including:
a first and a second input port arranged to receive a first and a second input signal respectively;
a main amplifier having an input and an output;
a first and a second auxiliary amplifier having respective inputs and outputs;
an internal load connected to the output of the first auxiliary amplifier;
a feedback network arranged to linearize the first input signal and having an input end connected to the output of the first auxiliary amplifier and an output end connected to the input of the first auxiliary amplifier; and,
a feedforward amplifier having an input and an output;
wherein;
the inputs of the main amplifier and the auxiliary amplifiers are interconnected with the first input port at a common input node;
the output of the second auxiliary amplifier and the second input port are interconnected with the input of the feedforward amplifier at a common node;
the outputs of the feedforward amplifier and the main amplifier are interconnected at a common output node;
and wherein;
the main amplifier is a replica of the first and second auxiliary amplifiers with an increased gain; and,
the second auxiliary amplifier is a replica of the first auxiliary amplifier;
the ratio of the second input signal over the first input signal input is the same as the ratio of the gain provided by the second auxiliary amplifier over the gain provided by the first auxiliary amplifier;
the method comprising:
obtaining the deviation from an ideal response on the first auxiliary amplifier by means of the feedback network;
isolating said deviation by removing the second input signal from the output of the second auxiliary amplifier;
amplifying the isolated deviation by means of the feedforward amplifier; and
adding said amplified deviation to the output of the main amplifier.

* * * * *